(12) United States Patent
Pechberti et al.

(10) Patent No.: US 10,133,834 B2
(45) Date of Patent: Nov. 20, 2018

(54) METHOD FOR SIMULATING WAVE PROPAGATION; SIMULATOR, COMPUTER PROGRAM AND RECORDING MEDIUM FOR IMPLEMENTING THE METHOD

(71) Applicant: INSTITUT FRANCAIS DES SCIENCES ET TECHNOLOGIES DES TRANSPORTS, DE L'AMENAGEMENT ET DES RESEAUX, Champs sur Marne (FR)

(72) Inventors: Steve Pechberti, Esbly (FR); Dominique Gruyer, Beynes (FR)

(73) Assignee: INSTITUT FRANCAIS DES SCIENCES ET TECHNOLOGIES DES TRANSPORTS, DE L'AMENAGEMENT ET DES RESEAUX, Champs sur Marne (FR)

( * ) Notice: Subject to any disclaimer, the term of this patent is extended or adjusted under 35 U.S.C. 154(b) by 109 days.

(21) Appl. No.: 15/039,198

(22) PCT Filed: Nov. 24, 2014

(86) PCT No.: PCT/FR2014/053013
§ 371 (c)(1),
(2) Date: May 25, 2016

(87) PCT Pub. No.: WO2015/079152
PCT Pub. Date: Jun. 4, 2015

(65) Prior Publication Data
US 2017/0132335 A1    May 11, 2017

(30) Foreign Application Priority Data
Nov. 26, 2013 (FR) ..................................... 13 61645

(51) Int. Cl.
*G06F 17/50* (2006.01)
*G01S 13/93* (2006.01)

(52) U.S. Cl.
CPC ........ *G06F 17/5009* (2013.01); *G01S 13/931* (2013.01)

(58) Field of Classification Search
CPC .......................... G06F 17/5009; G01S 13/931
(Continued)

(56) References Cited

U.S. PATENT DOCUMENTS

| 2001/0019307 | A1* | 9/2001 | Sato | ........................ | G08G 1/017 340/928 |
| 2013/0155808 | A1* | 6/2013 | L'Her | ..................... | G01S 11/14 367/19 |
| 2015/0056613 | A1* | 2/2015 | Kural | ..................... | G06F 19/22 435/6.11 |

OTHER PUBLICATIONS

International Search Report for International Application No. PCT/FR2014/053013 dated Mar. 18, 2015 (3 pages).
(Continued)

*Primary Examiner* — Eunhee Kim
(74) *Attorney, Agent, or Firm* — Hamre, Schumann, Mueller & Larson, P.C.

(57) ABSTRACT

The method for simulating wave propagation wherein:
a) data representing a three-dimensional scene (14) are supplied;
b) primary rays ($P_{ij}$) emitted in different propagation directions are calculated;
d) as a function of a point of reception (P), is calculated primary scattered rays ($R_{dA}$, $R_{dB}$), emitted by the surfaces of the objects present in the scene reached by a primary ray.
The power transported by the scattered rays ($R_d$) is calculated as a function of the relative orientation between the primary incident ray that reaches the surface of the object in question and the normal to this surface.
(Continued)

Simulator, computer program and recording medium for implementing the method.

19 Claims, 7 Drawing Sheets

(58) Field of Classification Search
USPC .......................................................... 703/2, 8
See application file for complete search history.

(56) References Cited

OTHER PUBLICATIONS

Written Opinion for International Application No. PCT/FR2014/053013 dated Mar. 18, 2015 (10 pages).
Muhaiyiddin et al.: "Development of Digital Vehicle Distance Monitoring System"; International Conference on Future Computer and Communication, 2009, pp. 612-616.
C. Macaskill: "Geometric optics and enhanced backscatter from very rough surfaces"; Journal of the Optical Society of America, 1991, vol. 8, pp. 88.

\* cited by examiner

METHOD FOR SIMULATING WAVE PROPAGATION; SIMULATOR, COMPUTER PROGRAM AND RECORDING MEDIUM FOR IMPLEMENTING THE METHOD

The invention relates to a method for simulating wave propagation, especially electromagnetic or even acoustic.

There is a growing need to use simulation, whether this is for development of novel products, or for qualification or homologation of the latter. In fact in the event where a product interacts with waves, it can be necessary to simulate propagation of these waves and their interaction with the product. The waves can in some cases be produced by the product itself: this is the case for example for ultrasound sensors, radars or lidars.

This case therefore occurs especially during development of radars or lidars on board vehicles. Such sensors are increasingly provided on board vehicles to ensure detection of obstacles and contribute to performing functions of active safety, assistance in driving or even automatic driving.

PRIOR ART

With respect to simulation of radars, for real-time or semi-real-time applications, existing simulation methods are usually based on starting them from a small number of rays, in a limited number of directions and a restricted solid angle, the objects present in the scene being considered simplified in the form of their Radar Cross Sections (RCS).

Also, statistic models originating from a test campaign are sometimes also used for simulation of radars.

If the use of RCS tables is often acceptable for aerial radars, for which the number of objects to be modelled is very restricted, inversely this method is inapplicable for radars on board terrestrial vehicles, whereof the close environment comprises a very wide variety of possible objects, and also moveable relative to each other.

In fact in such environments, propagation simulation of radar waves based on RCS tables, in practice proves insufficient since it manages only relatively approximately the masking of elements and dephasing caused by multiple rebounds before the wave returns to the antenna.

The method therefore does not simulate waves received in return sufficiently closely to reality.

PRESENTATION OF THE INVENTION

As a result, there is a need for a method for simulating wave propagation, especially of electromagnetic waves (in particular, waves outside the visible spectrum, and/or non-coherent waves) or acoustic waves, which is likely to provide a representation of the propagation of simulated waves more realistically than simulations performed by using RCS.

This aim is achieved because the method comprises the following steps:
a) scene data are provided representing a three-dimensional scene comprising at least one object having a plurality of surfaces, each of said surfaces having a normal;
b) a plurality of primary rays emitted in respective propagation directions is calculated by means of a computer, each of said primary rays being defined at least by a transported power, a position, and a direction of propagation;
d) as a function of a point of reception, primary diffused rays are calculated by means of a computer, each of said primary diffused rays being emitted by a surface of said at least one object of the scene reached by a primary ray.

A ray diffused by a surface reached by a ray, so-called incident ray, here designates a ray emitted by the reached surface under the effect of the incident ray, having a direction of propagation passing through the point of reception, and having a transported power at least function of a relative orientation between the direction of propagation of the incident ray and the normal to the reached surface.

As the direction of propagation of a diffused ray, by definition, passes via the point of reception, a diffused ray is therefore (with some exceptions) a ray which is emitted in a direction other than the direction of a specular ray (ray reflected by the surface by specular reflection of the incident ray). In particular, the point of emission from which the primary rays are emitted is almost always very close to the point of reception; as a result, it is impossible for a specular ray to be directed to the point of reception.

Also in general, under the effect of the incident ray the surface therefore on the one hand emits a diffused ray and on the other hand emits different re-emitted rays, having propagation directions not passing through the point of reception (one of them being the specular ray).

The term 'calculation of a ray' here designates calculation of the attributes or characteristic parameters of this ray.

The "position" of a ray can be especially any information defining the point of emission of this ray. It can be obtained by means of the attributes of the point of emission of the ray.

The simulation method therefore determines the different rays received by an observer placed at a given point relative to the scene, so-called point of reception.

As is known per se, the method uses the technique of the "ray tracing": the wave emitted is considered as being the meeting of a set of emitted rays here called "primary rays".

An important characteristic of the method is the fact that during step d) rays diffused by the surfaces of the objects present in the scene are calculated.

For these rays, the transported power is at least a function of the relative orientation between the direction of propagation of the incident ray and the normal to the reached surface (This relative orientation is called hereinbelow "incidence angle" of the ray on the reached surface). So step d) simulates the radiation seen in return by the observer placed at the point of reception by taking into account the geometry of objects present in the scene, this geometry being taken into account by the fact that for each diffused ray the power transported by the diffused ray depends on the incidence angle of the primary ray on the reached surface.

The radiation seen in return at the point of reception is the superposition or the sum of diffused rays by the different surfaces of the objects of the scene in the direction of this point.

Modelling Objects

In general, objects present in the scene are recorded in the form of a set of planar surfaces: the normal to the surface of the object reached by the incident ray is simply the normal of the planar surface reached by the incident ray. Planar areas can be planar facets, especially triangular.

Other types of modelling of the geometry of the objects present in the scene can especially be envisaged, especially by non-planar surfaces (for example defined by B-splines, Bezier curves, etc.).

Modelling of the Rays; Ray/Surface Interaction

The quality of the simulation performed further depends on the model used for the interaction between the incident ray and the surface reached by the latter.

The predetermined interaction model between an incident ray and a surface of an object defines the properties of the ray(s) optionally emitted by the surface, as a function of the properties on the one hand of the incident ray that reaches the surface, and on the other hand of the surface.

The ray(s) emitted by the surface are (exclusively) either diffused rays such as defined previously, or rays known as "re-emitted" rays.

The calculation of the ray(s) emitted comprises the calculation of different parameters.

These parameters can include especially, for the emitted ray: its direction of propagation; its point of emission (this is the point of the surface reached by the incident ray); the energy or the power transported by the emitted ray; the polarisation of the emitted ray; the phase of the signal brought by the emitted ray; the distance covered by the ray from emission of the primary ray of origin; the frequency of the signal brought by the emitted ray.

They can also optionally comprise characteristics of transverse form of the ray, that is, characteristics of the form of a section of the ray in a plane transverse to its direction of propagation.

The values of each of the parameters of the ray can vary as a function on the one hand of the trajectory between the point of emission of the incident ray and the reached point on the reached surface (especially optionally as a function of parameters of the atmosphere between these two points); and on the other hand as a function of properties of the surface reached by the incident ray.

In particular, the energy or the power transported by a diffused or re-emitted ray can be at least a function of relative orientation between the incident ray and the normal to the surface reached by the latter.

The properties of a diffused or re-emitted ray, especially the energy or the transported power, can also optionally depend on the angle between the direction of propagation of this ray and the normal direction (or perpendicular) to the surface at the point of emission of this ray.

Also, the properties of diffused or re-emitted rays can depend, not only on the positions or relative orientations of the incident ray relative to the reached surface of the object, but also on properties of the object itself.

In an embodiment, a property, especially physical, of material constituting a surface of an object of the scene is used for calculating the diffused rays.

The property in question here can be a coefficient of reflection or transmission of the material of the reached surface of the object.

For example, the property of the surface can especially be defined by coefficients of reflection, transmission, scattering, of the incident ray, or by the electrical and magnetic permeabilities of the material in question, which can be single real numbers. The property of the surface can also be defined as much more complex for example by being a function of the bidirectional reflectance distribution function, or BDRF, of the material of the surface in question.

In this embodiment, it therefore suffices to attribute some parameters, some properties to materials, and to then define that surfaces of objects present in the scene consist of the material(s) as defined.

For calculation of a diffused ray, a predetermined interaction model between an incident ray and a surface reached by the latter can be considered.

So for example, in an embodiment, and in the event where the waves are electromagnetic, at step d) the power or the energy transported by the diffused ray(s) is calculated by using the electric field integral equation (EFIE). Advantageously, this equation calculates the properties of the diffused rays relatively simply.

Steps a), b) and d) of the simulation method described previously effectively simulate the propagation of rays in a three-dimensional scene.

However, the simulation method can be made even more realistic by taking into account the multiple reflections of the rays striking the scene.

With this aim, in one embodiment the simulation method further comprises a complementary step c) during which:

c) the propagation of incident rays is simulated especially iteratively such that at each iteration for each incident ray in question:

it is determined if the incident ray, by propagation in a straight line, reaches a surface of an object of the scene; and if as a function of a predetermined interaction model between an incident ray and a surface of an object at least one re-emitted ray (ray emitted by a surface of the scene, other than a diffused ray) is emitted after interaction of said incident ray with said reached surface:

the point reached on the reached surface is determined; and, said at least one ray re-emitted from the reached surface is calculated; said incident rays in question being:

during the first iteration, the primary rays calculated at step b);

during each of the subsequent iterations, the re-emitted rays calculated at the preceding iteration.

Furthermore at step d), the diffused rays emitted by the surfaces of the object(s) of the scene reached by a re-emitted ray are also calculated.

In this embodiment, the method can comprise one or more iterations at step c).

Also, as for the diffused rays a property, especially physical, of material constituting a surface of an object of the scene can be used for calculating the re-emitted rays.

The re-emitted rays such as defined at step c) can correspond to a transmitted wave or to a wave reflected by the object whereof the surface is reached by the incident ray. Other types of re-emitted rays can be taken into consideration as a function of the nature of the waves whereof propagation is simulated.

At step c), determining the reached point on the reached surface can consist of determining a point, defined by three-dimensional coordinates, or even by bidimensional coordinates on the reached surface. But that can also consist more widely of determining the reached surface, or part of the reached surface, therefore this operation is sufficiently precise to enable calculation of the characteristics of rays emitted following interaction of the incident ray with the reached element (reached point, portion of surface, or surface).

So in this embodiment of the method according to the invention, the 'ray tracing' technique is carried out much more realistically than in former embodiments wherein interaction between an object and an incident ray was modelled in a very simplified way by means of RCS.

In fact at step c) calculation of the re-emitted rays produces a more precise representation of the propagation of waves.

The re-emitted rays are generally calculated by taking into account the geometry of the object(s) present in the scene. So for example, one or more properties of the re-emitted ray(s) can be a function of the normal of the reached surface. The normal of the reached surface of the object is calculated naturally at the point of the surface reached by the incident ray.

In the event where the waves are electromagnetic waves the interaction model between the incident ray and the surface can be founded on the equations of physical optics.

In this case, in an embodiment, the power transported by a re-emitted ray is calculated by the Snell-Descartes law.

To calculate the direction of propagation of the re-emitted ray(s), in one embodiment, the direction of propagation of at least one emitted ray—and in general, of each of the re-emitted rays—depends solely on the direction of propagation of the incident ray and of the normal of the reached surface.

Via following step c), and in the event where the rays are electromagnetic in nature, for each incident ray only zero or a ray reflected by the surface (specular reflection) and optionally a ray transmitted inside the surface is calculated, if the surface is transparent. Following step d), if there is cause, the diffused ray is calculated by the surface under the effect of the incident ray.

Also, the method according to the invention, advantageously is a method having substantially constant complexity; i.e, the number of rays generally is relatively constant throughout the iterations.

In fact the incident rays which encounter no surface do not produce any emitted ray; inversely, transparent surfaces (which generally form only a minimal proportion of surfaces) can produce two re-emitted rays for one incident ray.

To determine the frequency of an emitted ray calculated at step c), in an embodiment, a relative speed of the surface reached by the incident ray, relative to the point of reception, is considered (it is a relative speed because the point of reception itself can optionally be animated by its own speed).

Structure of Data; Calculation Means: GPU

In addition to the physical parameters which govern the propagation of studied rays, the choice of some specific calculation means implements the method particularly efficaciously.

In particular, due especially to the choice of algorithm of ray tracing for the propagation of the emitted wave, the method can advantageously be implemented on a graphics card. So in a particularly interesting embodiment of the invention, step c) and/or step d) is conducted on a (single) graphics card (CGU), and the calculations made for each of the rays are done in parallel.

This embodiment therefore performs calculations of step c) and/or d) particularly rapidly. Because of this, the method can advantageously be implemented in real time or semi real time.

To implement the method on a graphics card as indicated previously, the scene data preferably consist mainly of at least one multidimensional matrix, or else by a set of individual three-dimensional data.

In the first case, the geometry of the objects is not recorded in the form of three-dimensional coordinates. On the contrary, the position of the objects is recorded in the form of the coordinates (line number and column number) of a datum in a matrix, as well as in the form of a depth value usually called 'z'. The geometry is therefore stored in one or more matrices usually called «Z-buffer». This matrix or these matrices containing geometry information of the objects of the scene form part of the scene data, recorded in a multi-dimensional matrix called 'G-buffer' (buffer or graphic buffer).

"Multi-dimensional" matrix here designates a set of matrices having the same number of lines and columns. Advantageously, a multi-dimensional matrix stores, for a same position (i,j) in the multi-dimensional matrix, not only scale information (such as for example depth information 'z'), but any amount of information relative to the element referenced at the placement (i,j).

In the second case by way of contrast, the geometry is recorded in the form of three-dimensional data. In this case, the scene data mainly comprise entities which contain the three-dimensional coordinates of the different surfaces of the objects contained in the scene. They can further comprise other data, recorded for example in multi-dimensional matrices, especially the different coefficients characterising the surfaces of the objects of the scene.

Furthermore, just as the scene can be recorded in a multi-dimensional matrix, the rays (primary, and/or diffused, and/or re-emitted) can advantageously also be recorded. Therefore in an embodiment, the primary rays, the re-emitted rays, and/or the diffused rays are recorded in a multidimensional matrix.

Preferably at step c) the direction of propagation of the re-emitted rays is calculated by means of the scene data and the characteristics of the incident rays, without introducing other data representing the geometry of the scene.

Also, in an embodiment of the method according to the invention, the calculations required at step c) and/or d) can be programmed on multiprocessor graphics card by means of "shaders".

A shader is a program, written in a language—either assembler or a highest-level language—directly executable by a graphics processing Unit, "GPU", and which replaces some parts of the usual execution pipeline. It is possible especially to use shaders programmed in GLSL language ("openGL Shading Language").

The use of "shaders" absolutely requires recording or modelling the data or information in the form of multidimensional matrices, which processes them by "shaders" substantially parallel, in a space called "image space".

This programming mode is therefore particularly adapted to the case where the scene and/or the rays (primary, re-emitted, and/or diffused) are represented by multidimensional matrices (i.e, by a G-buffer such as presented earlier).

In another embodiment, the calculations required at step c) and/or d) can be programmed on multiprocessor graphics card by using a programming language for multiprocessor graphics card authorising direct access to instructions and the memory of the different parallel calculation processors of the graphics card, such as for example the Cuda programming language (registered trade mark).

This mode of programming can especially be selected when the scene is represented in the form of three-dimensional data.

Simulation of Sensors

A particularly important application of the method for simulating wave propagation according to the invention is the simulation of sensors.

The invention also relates to a method for simulating a sensor, especially a sensor for a motor vehicle, the sensor being provided to emit waves and produce an output signal as a function of waves received in return following said emission of waves, the method comprising the following steps:

i) the emission of waves is simulated by the sensor, and the propagation of said waves, so as to determine rays received by the sensor, by carrying out a method for simulating wave propagation such as defined previously; and ii) the output signal of the sensor is determined as a function of the rays received by the sensor and predetermined characteristics of the sensor.

Sensor simulation is therefore first done by simulating the emission of waves by the sensor, then their propagation (step i). During propagation simulation of waves at this step i), the propagation of waves is simulated so as to calculate the diffused rays to be received by the sensor placed at the point of reception.

As a function of the characteristics of the sensor, the output signal of the sensor is then calculated. This calculation can be performed in different ways.

In an embodiment, the output signal of the sensor is determined at step ii) by performing the following two steps e) and f):

e) the respective signals of at least one part of said diffused rays are calculated; and f) a signal received at the point of reception is calculated by adding the respective signals calculated at step e2).

The output signal of the sensor is determined as a function of the signals from the different diffused rays returned by the scene and received by the sensor at the point of reception.

In particular, to limit calculation time it is preferable to calculate the signals transported by the diffused rays only for a reduced number of diffused rays.

For this purpose, step e) preferably comprises the following two sub-steps:

e1) a sub-set of diffused rays is selected as a function of a predetermined criterion, especially a criterion taking into account the transported power of the diffused rays, and/or at least one characteristic of adjacent rays such as total covered distance and/or a phase of the transported signal;

e2) the respective signals of the selected diffused rays are calculated only for the selected sub-set of diffused rays.

Typically, at step e) the selection of the sub-set of diffused rays is done by sorting the diffused rays by order of power or transported energy.

However, the respective signals from the different diffused rays can optionally be calculated for all the diffused rays.

The addition of the respective signals of the different diffused rays takes into account the respective characteristics of the diffused rays so as to produce an accumulated signal representative of reality.

Different parameters can be considered for boosting the quality of the simulation.

In an embodiment, for each re-emitted ray calculated at step c) a distance covered by the ray from the point of emission of the primary ray having generated the re-emitted ray in question is determined.

At step f) especially, this calculates for each selected diffused ray the power of the signal received by the sensor, taking into account the total distance effectively covered by the diffused ray, and consequently the loss of power (expressed for example in dB) which ensues.

The quality of the simulation can further be improved by adding a noise to the respective signals of the different selected diffused rays, and/or to the received signal calculated in this way.

The quality of the simulation can also be improved by taking into account precisely the operation of the wave emission antenna of the sensor (the term 'antenna' is used here to designate any wave emission system included in the sensor).

In an embodiment, at step b) an emission diagram is provided indicating power losses as a function of the direction of propagation, and the power transported by the primary rays is calculated as a function of the emission diagram.

The emission diagram realistically takes into account the real emission properties of the antenna of the sensor.

The invention also relates to a method for simulating a motor vehicle comprising at least one sensor, wherein a propagation of waves emitted and/or received by the sensor is simulated by carrying out a method for simulating wave propagation such as defined previously, in particular a method wherein the sensor is simulated by the sensor simulation method such as defined previously.

The invention also relates to a computer program comprising instructions for execution of the steps of one of the simulation methods defined previously.

The invention also relates to a recording medium readable by a computer on which a computer program is recorded comprising instructions for execution of the steps of one of the simulation methods defined previously.

The invention finally also relates to a wave propagation simulator, comprising:

a) a memory, capable of storing scene data representing a three-dimensional scene including at least one object having a plurality of surfaces, each of said surfaces having a normal;

b) primary calculation means, capable of calculating a plurality of primary rays emitted in respective propagation directions, each of said primary rays being defined at least by a transported power, a position, and a direction of propagation;

d) calculation means for diffused rays, capable of calculating as a function of a point of reception of the primary diffused rays, each of said primary diffused rays being emitted by a surface of said at least one object of the scene reached by a primary ray;

a ray diffused by a surface reached by a ray, so-called incident ray, being a ray reflected by the reached surface under the effect of the incident ray, having a direction of propagation passing through the point of reception, and having a transported power at least function of relative orientation between the incident ray and the normal to the reached surface.

In an embodiment, this simulator further comprises:

c) calculation means for re-emitted rays capable, especially iteratively, at each iteration and for each incident ray in question:

of determining if the incident ray, by propagation in a straight line, reaches a surface of an object of the scene; and if as a function of a predetermined interaction model between an incident ray and a surface of an object, at least one re-emitted ray is emitted after interaction of said incident ray with said reached surface:

of determining the reached point on the reached surface; and of calculating said at least one re-emitted ray from the reached surface;

said calculation means for re-emitted rays being arranged so as to take into consideration as incident rays:

during the first iteration, the primary rays calculated at step b);

during each of the subsequent iterations, the re-emitted rays calculated at the preceding iteration.

Furthermore, the calculation means for diffused rays are capable, at step d), of calculating diffused rays emitted by the surfaces of said at least one object of the scene reached by a re-emitted ray.

The invention will be understood and its advantages will emerge more clearly from the detailed following description of embodiments illustrated by way of non-limiting examples. The description refers to the appended drawings, wherein.

An embodiment of the method and of the device according to the invention will now be described in reference to the figures.

In the embodiment presented, the wave propagation method is a propagation method of electromagnetic waves used to simulate the operation of radar on board a vehicle, for example a car.

Figure 1:
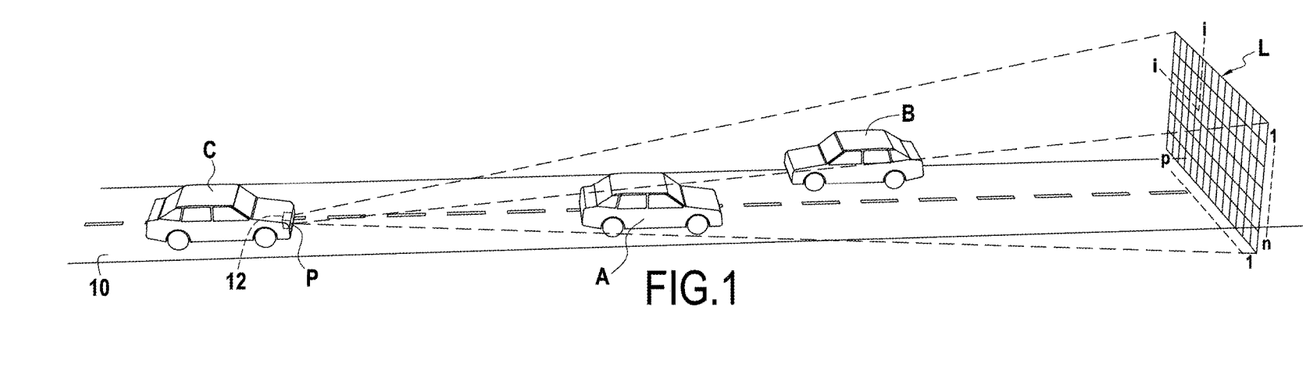
FIG. 1 is a schematic view of a road on which three vehicles travel.

Such radar is implemented typically in a scene such as that shown in FIG. 1.

This figure illustrates three cars A, B, C travelling on a road 10. The car C is equipped with a radar 12 and emits from a point P (more precisely, from an area considered as substantially specific) electromagnetic radiation.

The portion of this radiation which is exploited is that which propagates in the solid angle S shown in FIG. 1. This solid angle S divides itself into a matrix of elementary solid angles $S_{ij}$ where i designates the line and varies from 1 to n, and j designates the column and varies from 1 to p.

The part of the space included in the solid angle S, and limited to the side in front of the car C by a plane L located at a predetermined distance from the car C (actually around 200 meters from the latter) constitutes a scene 14. The function of the radar 12 is to detect obstacles inside this scene.

Figure 9:
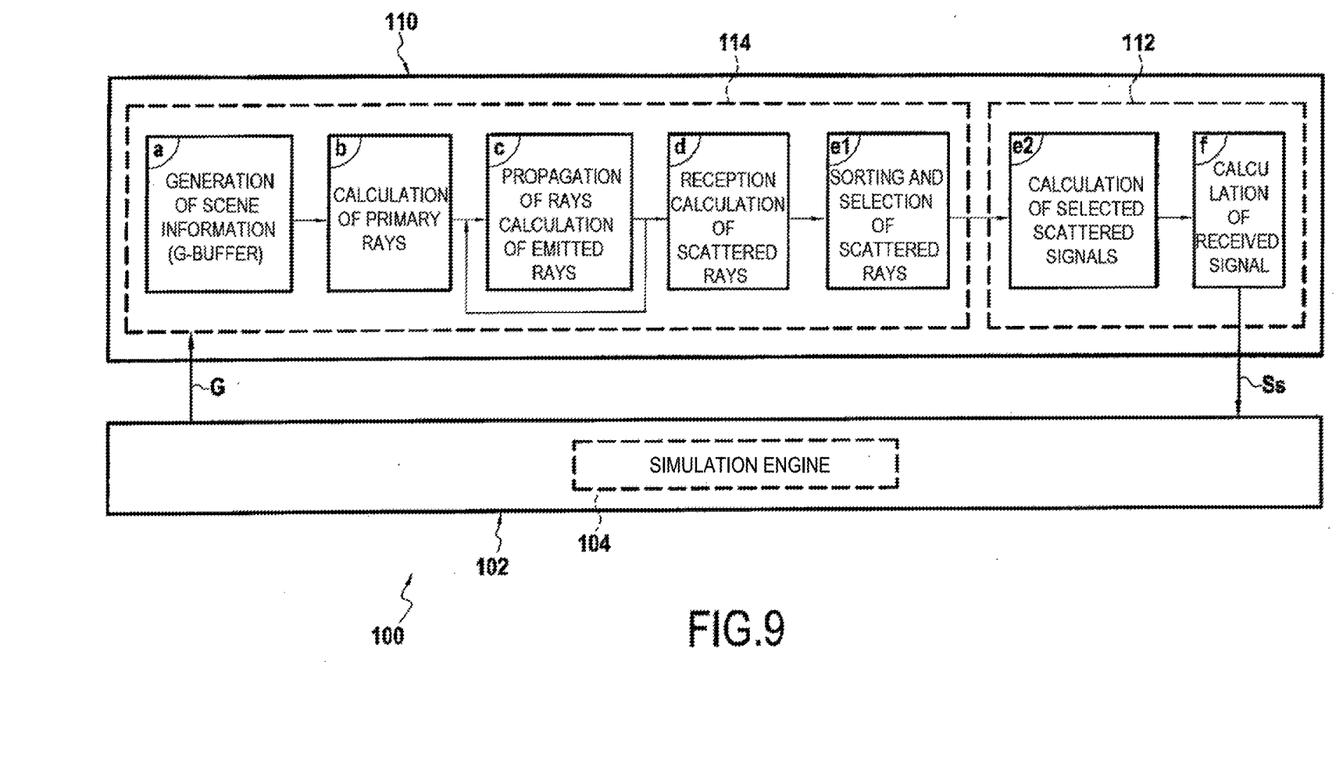
FIG. 9 is a schematic representation of the method for simulating wave propagation according to the invention.

In a first instance, the major steps of method for simulating propagation of rays according to the invention will be presented in relation to FIG. 9.

This figure presents the radar simulation as a peripheral process of a principal process which is the operation simulation of a motor vehicle.

The car C travelling on the road 10 in fact is simulated by a motor vehicle simulator 100.

This simulator 100 includes a central calculator 102 which executes a computer program 104 for vehicle simulation, so-called 'simulation motor'. This program 104 simulates the travel of a vehicle, and especially in the present case, the travel or displacement of the car C.

For this, the program 104 simulates the acquisition of different information acquired by the sensors of the car C. It therefore simulates especially the acquisition of information supplied by the radar 12.

This latter simulation (radar simulation) is performed by a radar computer 110 which comprises a central unit 112 with a main processor and a storage memory, as well as a graphics card 114.

The program 104 operates iteratively, with a processing loop in real time or in semi-real time simulating the evolution of the traffic at regular intervals, for example 40 ms (in real time).

At each processing loop, the program 104 transmits to the radar computer 110 the geometric description ('G', FIG. 9) of the scene which is facing the radar 12 at the relevant instant. This description includes the relative speeds relative to the radar 12 of the different objects present in the scene.

In the graphics card, a processing program also noted 114 is recorded.

The graphics card executes the program 114 so as to perform the following processing:

a) On receipt of data relative to the scene 14, the program 114 constitutes scene data representing the scene placed facing the radar 12;

b) the program 114 realises a 'ray tracing', and thus calculates the characteristics of the different primary rays which are emitted by the radar;

c) iteratively, the program 114 simulates the propagation of the incident rays in the scene 14. These incident rays are:

during the first iteration, the primary rays emitted by the radar; and during each of the subsequent iterations, the re-emitted rays calculated at the preceding iteration.

Also, at each iteration and for each of the incident rays, the program 114 determines if the incident ray reaches a surface of an object of the scene by propagation in a straight line.

If this is the case, the program 114 determines whether one or more rays are re-emitted after interaction of the incident ray in question with the reached surface. Emission of one or more rays after this interaction, and the characteristics of the re-emitted ray(s), are determined as a function of the interaction model between an incident ray and a surface of an object, which is chosen in advance.

The program 114 therefore on the one hand determines the reached point on the reached surface; and on the other hand the characteristics of the re-emitted ray(s) from the reached surface under the effect of the incident ray in question.

d) the program 114 calculates the rays diffused by the different surfaces present in the scene 14 in the direction of the point of reception, i.e, here in the direction of the radar 12;

e1) the program 114 selects a sub-set of diffused rays as a function of a predetermined criterion taking into account the power or the transported energy of the diffused rays; it transmits this information to the central unit 112 of the computer 110.

In the central unit, a processing program also noted 112 is recorded. The program 112 executes the following processing:

e2) the program 112 calculates signals respectively for each of the selected diffused rays at step e1).

f) the program 112 calculates a signal received by the radar by adding the respective signals calculated at step e2). It calculates the output signal Sr of the radar as a function of the signal received by the radar.

a) Scene Data

To simulate the operation of the radar 12, scene data representing the scene 14 are used or are first created.

These data comprise at a minimum a set of geometric data including in principle any object present in the scene, on condition that the latter is of sufficient size to be detectable in a solid elementary angle $S_{ij}$.

For each object, the scene data therefore comprise, for its different surfaces likely to be illuminated by a ray emitted by the radar, a simplified description of the surface, comprising especially the coordinates of the normal vector to the surface.

The scene data also preferably include different coefficients or parameters characterising the surface (or of the material constituting the surface) and serving as calculation of the re-emitted rays following interaction of an incident ray with the surface.

These coefficients can be especially coefficients characterising the properties of the surface relative to reflection, transmission and scattering of incident rays.

These coefficients can be for example refractive indices, thickness, roughness . . . .

Furthermore, the scene data can include, for each surface, indication of the instantaneous speed of the surface relative to the radar.

These different coefficients are in general recorded by reference to the material constituting the surface.

In this case, for each material constituting a surface of the objects present in the scene 14, coefficients characterising the response of the material are recorded when a surface consists of this material receives an incident ray, this incident ray having the frequency and the wave form produced by the radar whereof the operation is simulated.

The scene data are recorded in the memory of the graphics card 114.

They can be recorded in different ways.

In the embodiment presented here, they are recorded in the form of a multidimensional matrix M (FIG. 2), also called "G-buffer" or "Graphics-buffer". The matrix M includes the same number of lines and columns as the matrix of elementary solid angles, but it consists of a certain number (q) of individual matrices, noted $M_1, M_2, \ldots M_q$. In this way, the location of each surface of an object of the scene is recorded only on the one hand via the components (i,j) of the matrix element wherein the surface is recorded, and on the other hand by a depth information 'z', which is recorded in the matrix M, for example in the matrix $M_1$. This is therefore a Z-buffer.

Figure 2:
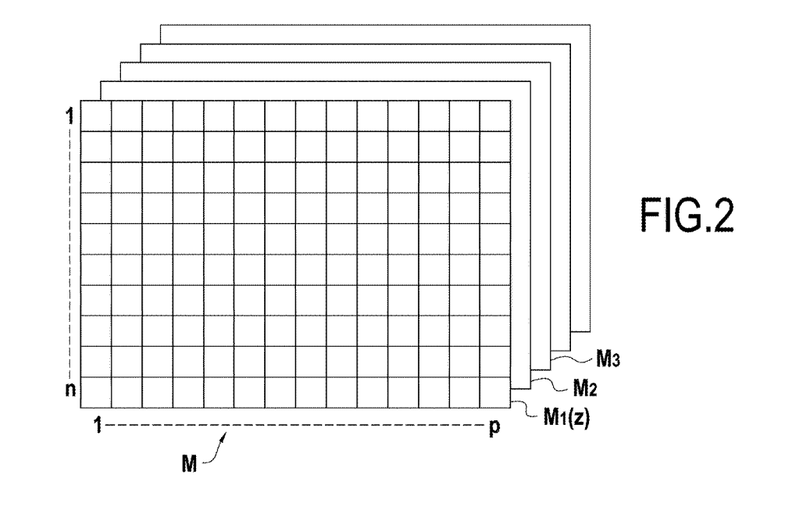
FIG. 2 is a schematic view representing a data structure for recording geometry of a scene.

The following matrices $M_2, M_3, \ldots M_u$ serve to record the other properties of the surface (these properties are recorded in this example by u–1 real numbers). These other properties can consist of an indication of the material constituting the surface, the properties of this material also being recorded.

If in a given elementary solid angle, the scene comprises several successive surfaces at increasing distances of the point P, these different surfaces are recorded in the matrix M, in individual matrices $M_k$, where k begins for example at the value u+1.

Alternatively, the scene data can be recorded as a three-dimensional scene comprising objects in turn composed from a set of facets, especially triangular, surface properties being associated with the facets in the form of textures especially, by means of texture coordinates as is known per se.

b) Calculation of Primary Rays

The simulation of the operation of the radar first requires calculation of the rays emitted by the radar from the point of emission P (primary rays).

To simplify calculation, a primary ray $P_{ij}$ is calculated for each elementary solid angle $S_{ij}$. The primary rays are therefore recorded in a multidimensional matrix similar to the matrix M described previously.

Figure 4:
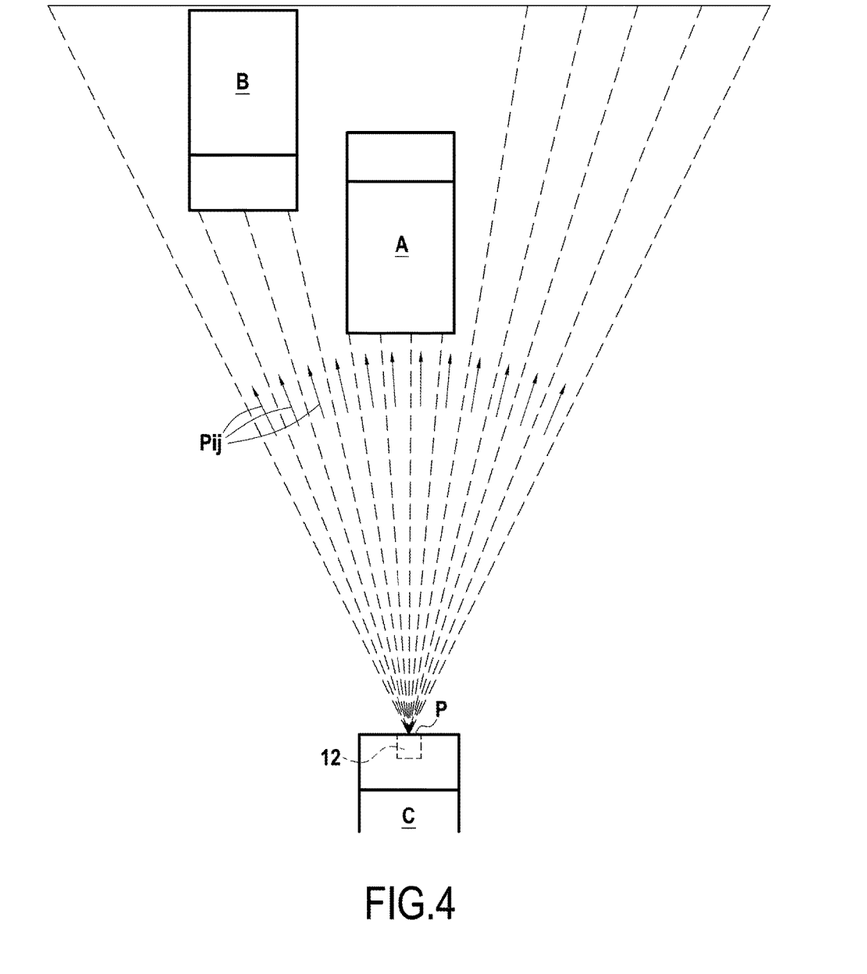
FIG. 4 is a schematic plan view representing the propagation of primary rays projected by the radar in the scene of FIG. 1.

FIG. 4 illustrates in a schematic way the primary rays $P_{ij}$ emitted on a horizontal line of solid angles $S_{ij}$.

For each primary ray $P_{ij}$ the following information is recorded:
 its direction of propagation (this is recorded implicitly by the coordinates (i,j) of the ray in question $P_{ij}$);
 its point of emission (for the primary rays, it is the point P);
 the power transported by the emitted ray. This information is recorded in the form of a gain—negative—in dB relative to the maximal initial power of a primary ray;
 the polarisation of the primary ray;
 the phase of the signal carried by the primary ray;
 the distance covered by the ray from the emission of the primary ray of origin (zero distance, in the case of primary rays);
 the frequency of the signal carried by the primary ray.
 the Doppler coefficient linked to the primary ray (zero coefficient in the case of primary rays).

The gain value is not the same for all primary rays. In fact, for each primary ray, the gain is provided by the emission diagram of the emission antenna of the radar 12. This antenna diagram indicates, as a function of the elementary solid angle $S_{ij}$, the energy or the effective power- and therefore the gain—of the ray which the radar emits in the elementary solid angle. It is therefore this value which is recorded as initial gain for each primary ray. Actually, the gain of primary rays is high at the centre of the ray emitted by the radar, and weaker at the sides.

c) Propagation of Rays

Figure 3:
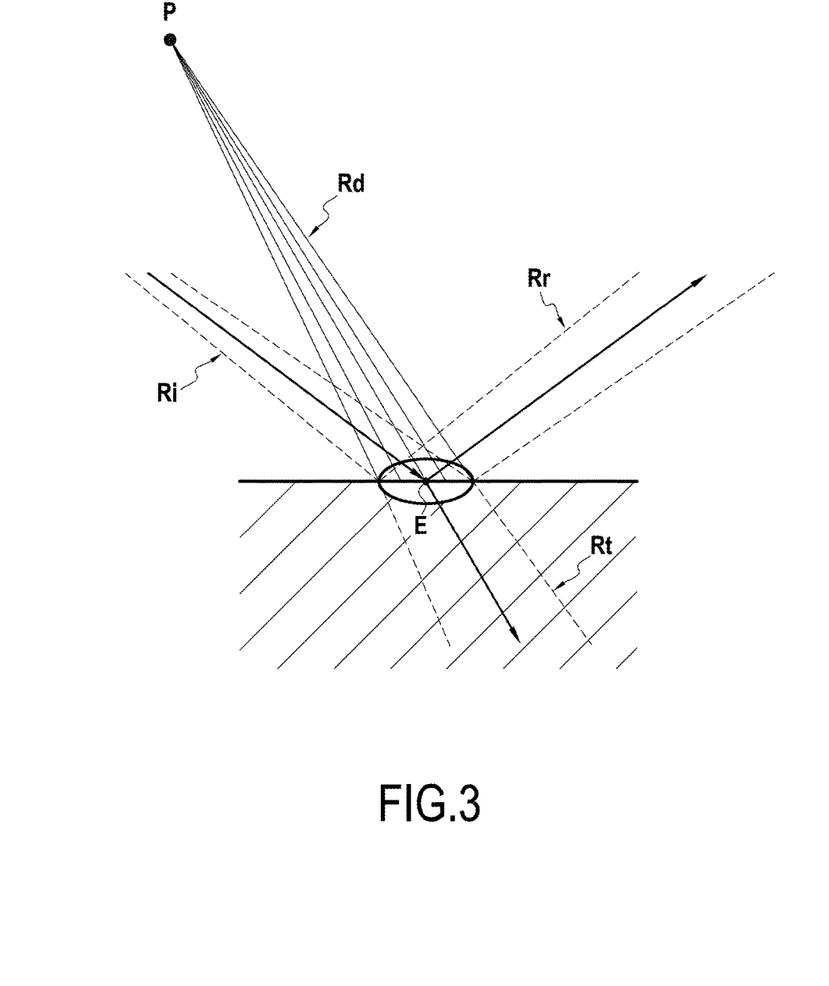
FIG. 3 is a schematic view representing the interaction of an incident ray with a surface of an object.

The propagation of rays is founded on an interaction model with the surface as known per se (FIG. 3). According to this model, as a function of parameters of reflection, transmission and scattering of the surface, when an incident ray $R_i$ strikes a surface at a point E, it can be absorbed without emission of any radiation; it can produce a reflected ray Rr; it can produce a transmitted ray Rt.

The characteristics of these different rays each depend on the direction of incidence (and therefore on the direction of propagation of the incident ray) and on the normal n to the surface.

Also, radiation can be diffused from the point E in the direction of reception (which can be the direction of emission of the primary rays); there is projection of a diffused ray Rd in the direction of the point P.

Furthermore, in this embodiment, interaction of the incident ray with the reached surface is based on the following hypotheses:

It is considered that the incident ray acts a planar monochromatic wave, and even if the signal transported by the incident ray (for example, in radars having FMCW, FSK modulations, having pulses, . . . ) is in reality the superposition of several monochromatic waves.

It is also considered that when an electromagnetic wave front interacts with the surface of an object (or the interface between two media), this surface is considered locally as planar and it is assimilated as an infinite plane for calculation of the emitted ray. (However, calculation can optionally include the curve of the surface).

Figure 5:
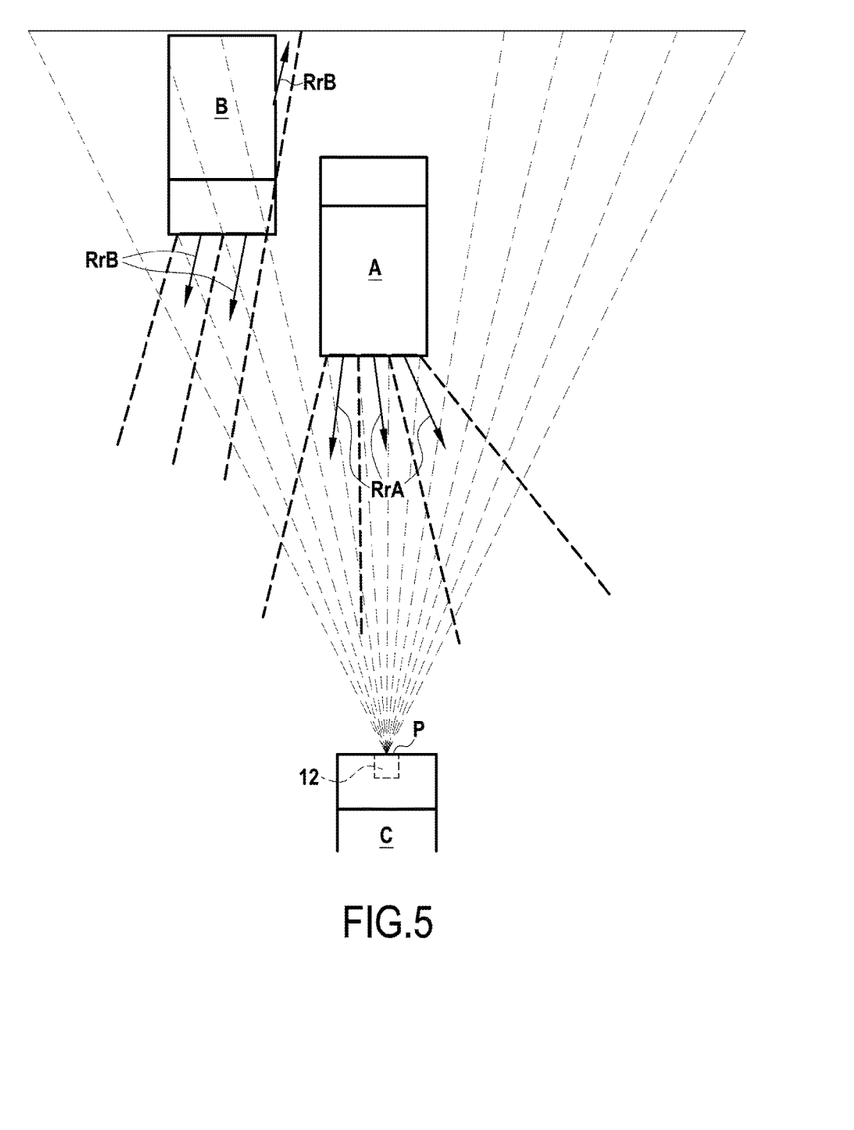
FIG. 5 is a schematic plan view representing the propagation of re-emitted rays emitted by the vehicles present in the scene of FIG. 1 after reception of the primary rays.
Figure 6:
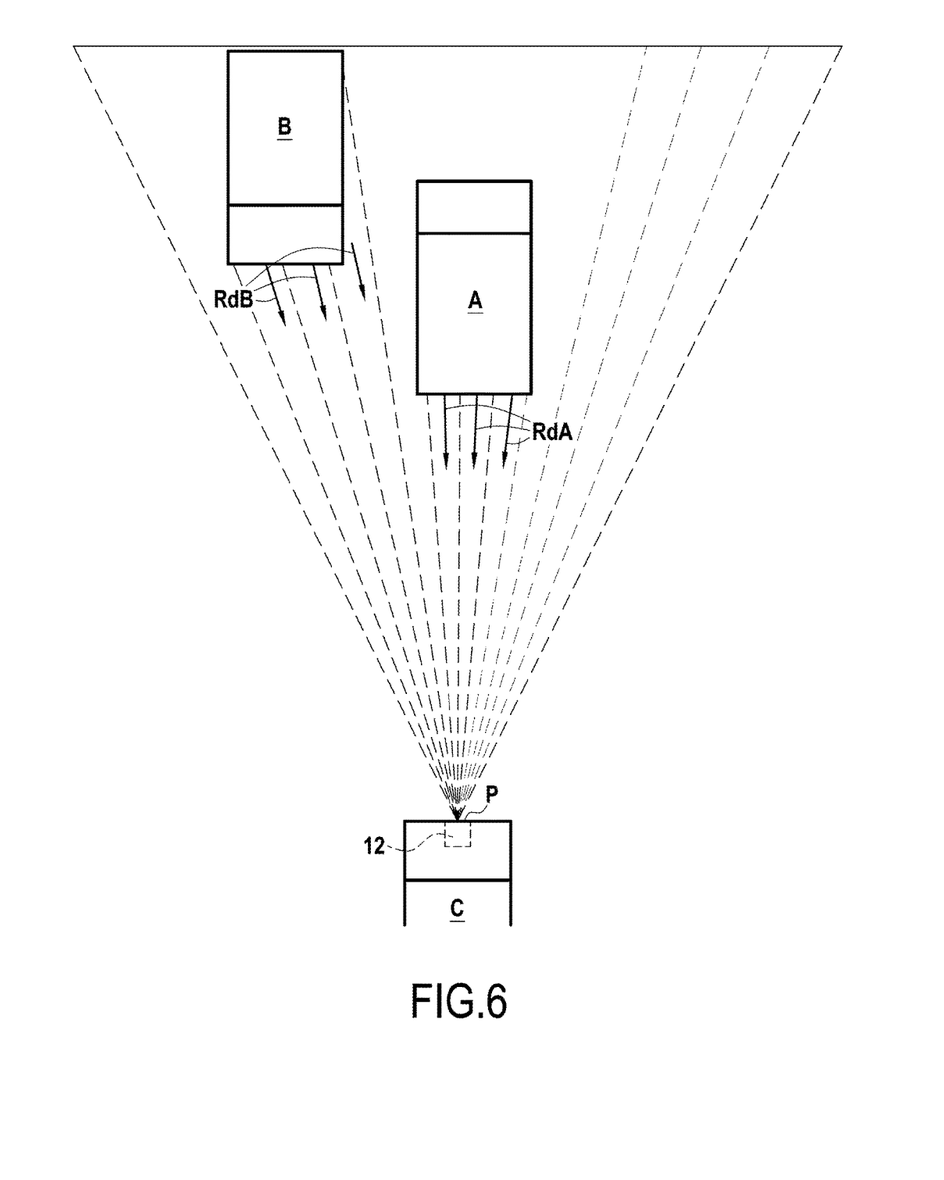
FIG. 6 is a schematic plan view representing the propagation of diffused rays by the vehicles present in the scene of FIG. 1 after reception of the primary rays.

An example of an interaction of primary rays with the objects of the scene is illustrated by FIGS. 4 to 6.

In one of the emission planes of primary rays $P_{ij}$ (j=Cte), illustrated by FIG. 4, the primary rays strike the vehicle A in three elementary solid angles and the vehicle B also in three elementary solid angles (bold arrows, FIG. 4).

For each primary ray $P_{ij}$, during the first iteration of the program 114 at step c) the interaction of different primary rays $P_{ij}$ with the surfaces of the objects present in the scene is evaluated.

It is evident that interaction with the ground constituting the road 10 must normally be taken into account; however for simplifying explanations, this interaction is not discussed in the example shown.

On vehicle A, the reached surfaces are opaque surfaces located behind the vehicle; no ray is transmitted through the surface. But these surfaces do produce three re-emitted reflected rays $R_{rA}$.

On vehicle B, the reached surfaces are the transparent surfaces of the front windshield of the vehicle. These surfaces first produce three re-emitted reflected rays $R_{rB}$. Being transparent, they also produce three re-emitted transmitted rays $R_{tB}$.

The evaluation of the interaction between the primary rays (or, at later steps of calculation, the incident rays) and the surfaces of the objects of the scene therefore results in creating new rays, the re-emitted rays $R_{rA}$, $R_{rB}$, $R_{tB}$.

These rays do not have the same characteristics as the primary rays.

Their characteristics are calculated as follows:

the direction of propagation is calculated as per the interaction model with the surface in question as a function of the direction of the incident ray and of the normal direction of the surface at the point struck by the incident ray;

the point of emission of the re-emitted ray is the point of the surface struck by the incident ray;

the gain, the polarisation of the re-emitted ray are calculated as per the interaction model with the surface in question, as a function of the characteristics of the surface, and optionally as a function of the direction of the incident ray and of the normal direction of the surface at the point struck by the incident ray;

the phase of the signal carried by the re-emitted ray, and the distance covered by the ray from the emission of the primary ray of origin, are calculated as a function of the position of the point struck on the surface, relative to the radar, and optionally as a function of properties of the surface; and the frequency of the signal carried by the re-emitted ray is calculated as a function of the relative speed of the surface relative to the radar.

An important parameter is the gain of the re-emitted ray, which corresponds to the power of the signal transported by the ray.

The program 114 calculates the gain of the re-emitted rays by using the equation of physical optics: The power transported by a re-emitted ray is calculated by the Snell-Descartes law.

Naturally, a large number of primary rays encounters no surface of an object of the scene 14; these rays do not produce any emitted ray.

At step c), after the first interaction of each of the primary rays with the surfaces of the objects of the scene 14 has been evaluated, the program 114 can perform one or more iterations so as to calculate one or more subsequent interactions between the re-emitted rays and the surfaces of the objects of the scene.

In the example shown however, the program 114 is parameterised so as to pass step d) as soon as the second iteration of step c) has been performed, i.e. as soon as all the primary rays have reached the surfaces they can reach by propagation in a straight line from point P.

More generally, the program 114 can be parameterised so as to pass step d) either after a fixed number of iterations, or when another criterion has been attained.

Optionally, step c) can not be performed. The program 114 moves directly from step b) to step d).

The calculations are performed substantially parallel on the graphics card 114. The number of primary rays is selected so as to engender a number of rays which can be processed by the graphics card at the preferred processing frequency.

d) Calculation of Diffused Rays

At step d), the program 114 calculates the diffused rays by the different surfaces present in the scene 14 in the direction of the radar 12.

This calculation is done for each of the surfaces of the scene 14. The same surface can optionally produce several emitted (diffused or re-emitted) rays if it is reached by several incident rays, especially during several iterations performed at propagation step c).

In the example shown, step c) is stopped on completion of the first iteration.

The program 114 therefore calculates six diffused rays: three rays $R_{dA}$ diffused by the rear wall of the car A, and three rays $R_{dB}$ diffused by the front wall or the side wall of the car B. The program 114 does not calculate ray $R_{dB}$ for the other surfaces of the car B, since on completion of the first iteration (FIG. 5), only the front wall and a side wall of the car B have been reached by incident rays (since this is the first iteration, the incident rays are the primary rays $P_{ij}$).

For each surface of the scene 14, the program 114 calculates any diffused ray(s) emitted by the surface, taking into account the set of incident rays having reached the relevant surface during the different iterations of step c).

The diffused rays comprise substantially the same parameters as the primary rays.

e1) Sorting and Selection of Diffused Rays

Following step e1), the program 114 selects a sub-set of diffused rays as a function of a predetermined criterion taking into account the power transported by the diffused rays.

This criterion is founded more precisely on the power returned to the antenna, which is a function of the power transported by the diffused rays.

The power returned to the antenna by a diffused ray is calculated on the basis of characteristics of the reception antenna of the radar 12, especially the dimensions or the surface of the latter. It is optionally calculated as a function of the gain of the antenna, this gain depending on the direction of origin of the diffused ray.

More specifically, this power is calculated on the basis of the electric field integral equation, by integrating the flow of the Poynting vector of the diffused ray through the surface of the antenna.

The calculation for each diffused ray of the power returned to the antenna by the diffused ray proceeds with selection of the diffused rays which will be considered for calculation of the signal received effectively by the radar. In fact, this selection actually consists of then considering calculating only those rays which will return substantial power to the radar.

For this purpose, the first step is sorting the diffused rays as a function of the power returned to the antenna by each; next, only the diffused rays of greater power returned to the antenna are kept.

This selection work reduces the number of data to be transmitted to the central unit 112 of the radar computer 110, and substantially without loss in simulation performance to the extent where the eliminated diffused rays are rays whereof the contribution to the radar signal is very small and therefore negligible.

According to a variant, still with the aim of limiting the quantity of information raised by the RADAR propagation channel simulator accelerated by the GPU, the diffused rays are selected as follows:

Groups of rays having similarities in terms of position, total distance covered by the ray, dephasing, and/or frequency are formed first. Such combining of rays can be done by clustering algorithms directly on the graphics card and in parallel, by the program 114.

Each group of diffused rays is then characterized by the statistical values characteristic of the group: average and variance in the total distance covered, average and variance of dephasing, average and variance of the direction of reception, total power.

In this case, for selecting some of the diffused rays, the groups of rays of greatest importance are selected. The isolated rays, or the groups of minimal importance are assimilated with radar noise (clutter) and then eliminated.

Selection can be made by taking into account the total distance covered, optionally in addition to the criteria cited previously. For example, one can select only the N rays (N is an integer) having the shortest total distance covered before return to the point of reception.

Information corresponding to the groups of rays selected can therefore be transmitted to the program 112 of the radar computer 110 synthetically by transmitting only aggregated values corresponding to the groups of selected rays.

e2) Calculations of Signals from the Diffused Rays

Data relative to the diffused rays thus selected are then transmitted to the central unit 112 of the radar computer 110.

On reception of these information (step e2)), the program 112 calculates a signal $S_d$ for each of the selected diffused rays. This signal is calculated on the basis of the signal initially emitted by the radar, such as shown by FIG. 7.

The respective signals $S_d$ thus generated for the different selected diffused rays are calculated by hypothesising that the primary rays are emitted over the same time period between instants 0 and T. The duration T is selected so as to be longer as compared with the dephasing caused by the differences in flight distance between the different rays (the scales in FIGS. 7 and 8 are not representative).

Figure 7:
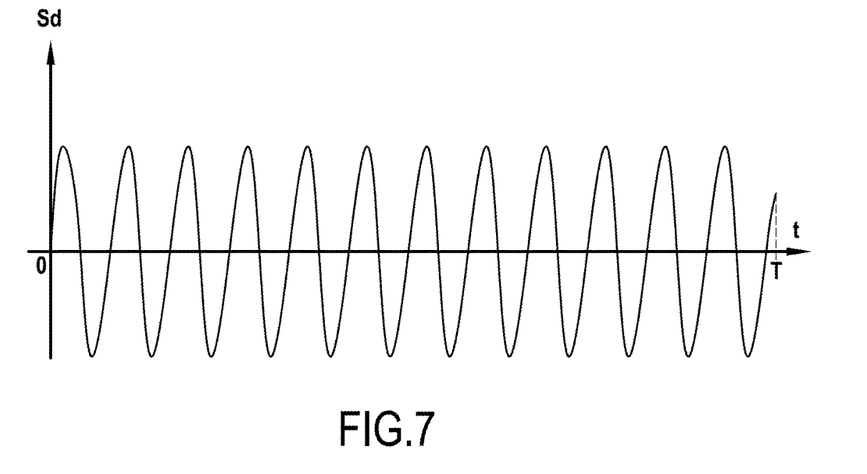
FIG. 7 is a schematic view of a signal transported by a radar ray.
Figure 8:
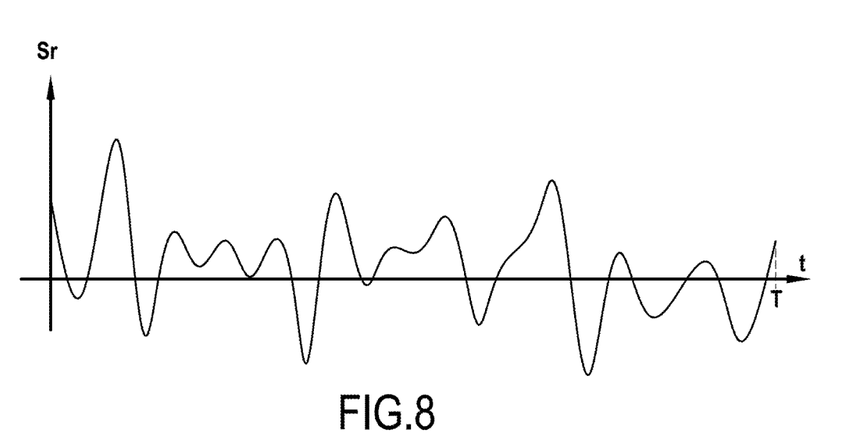
FIG. 8 is a schematic view of a signal received by the radar.

Even though FIG. 7 represents a sinusoidal signal at constant frequency, it is clear that the method can be used with any type of radar signal, especially signals of variable frequencies, continuously or in increments, for example (FSK, FMCW, . . . ).

The individual signals corresponding to each of the diffused rays have a form close to the initial radar signal, for example in the present case a sinusoidal form.

However, they are modified relative to the initial signal especially by considering the following parameters of the diffused ray: the phase of the ray, the energy or the power transported by the ray (or the power returned to the antenna), the polarisation of the ray, and if appropriate the distance covered by the ray from emission of the primary ray, the frequency of the transported signal by the ray.

f) Calculation of Signal Received by Radar and of Output Signal of the Radar

Following step f), the program 112 calculates the signal $S_r$ received by the radar by adding the respective signals $S_d$ from the different selected diffused rays, calculated at step e2).

This calculation considers reception parameters particular to the radar itself, i.e, reception antenna parameters.

On the basis of the signal $S_r$ received by the radar, the program 112 calculates the output signal of the radar $S_s$.

The resulting output signal of the radar $S_s$ is then transmitted to the program 104 for simulating vehicle displacement (FIG. 9).

This signal $S_s$ can then be subject of complementary processing, then be combined with other information acquired by other sensors of the vehicle, for example to feed a program automatically determining the commands to be applied to the vehicle to ensure control or driving of the latter.

Finally, even though the example shown, radar having a single antenna for emission and reception has been used, the invention can be implemented with a plurality of ray sources. It can also be implemented by evaluating the diffused rays (step d)) not for a single reception position, but for several reception positions.

In the example shown, the graphics card 114 constitutes both the primary calculation means, the calculation means of diffused rays, and the calculation means of re-emitted rays, in terms of the invention.

The invention claimed is:

1. A computer-implemented method for generating an output signal outputted by a sensor for a motor vehicle when the sensor is placed at a point of reception facing a three-dimensional scene, the sensor being provided to emit waves and produce the output signal as a function of waves received in return following emission of the emitted waves, the method comprising:
  i) simulating an emission of waves by the sensor and a propagation of the waves so as to determine rays received by the sensor, the simulation comprising:
    a) acquiring, by a processor, scene data representing the three-dimensional scene and storing the scene data in a memory of the processor, wherein the scene data includes at least one object having a plurality of surfaces, each of the surfaces having a normal;
    b) calculating, by the processor, a plurality of primary rays to be emitted by the sensor towards the scene in respective propagation directions, each of the plurality of primary rays being defined at least by a transported power, a position, and a direction of propagation;
    d) calculating, by the processor, a plurality of primary diffused rays as a function of the point of reception, each of the plurality of primary diffused rays being emitted in a direction other than a direction of a specular ray by a surface of the plurality of surfaces of the at least one object of the scene reached by a primary ray of the plurality of primary rays; and
    a ray diffused by a surface reached by an incident ray being a ray emitted by the reached surface under an effect of the incident ray, having a direction of propagation passing through the point of reception, and having a transported power that is at least a function of relative orientation between the incident ray and the normal to the reached surface; and
  ii) determining, by the processor, the output signal of the sensor as a function of the rays received by the sensor and predetermined characteristics of the sensor.

2. The method according to claim 1, wherein the scene data consist mainly of at least one multidimensional matrix or a set of individual three-dimensional data.

3. The method according to claim 1, wherein when the waves are electromagnetic, at step d) the transported power of the at least one diffused ray is calculated by using an electric field integral equation.

4. The method according to claim 1, further comprising step c) wherein:
   c) the propagation of incident rays is simulated, especially iteratively, such that at each iteration for each incident ray in question:
      it is determined if the incident ray, by propagation in a straight line, reaches a surface of an object of the scene; and
      if as a function of a predetermined interaction model between an incident ray and a surface of an object, at least one re-emitted ray is emitted after the interaction of the incident ray with the reached surface:
      a point reached on the reached surface is determined; and,
      the at least one re-emitted ray from the reached surface is calculated;
   the incident rays in question being:
      during a first iteration, the plurality of primary rays calculated at step b);
      during each subsequent iteration, the re-emitted rays calculated at a preceding iteration;
   and
   at step d), diffused rays emitted by the surface of the at least one object of the scene reached by the at least one re-emitted ray are also calculated.

5. The method according to claim 4, wherein at least one property of at least one re-emitted ray is a function of the normal of the reached surface.

6. The method according to claim 4, wherein the direction of propagation of each of the re-emitted rays depends solely on the direction of propagation of the incident ray and of the normal of the reached surface.

7. The method according to claim 4, wherein when the waves are electromagnetic, the transported power by the at least one re-emitted ray is calculated by the Snell-Descartes law.

8. The method according to claim 4, wherein step c) and/or step d) is conducted on a single graphics card, and the calculations made for each of the rays are done in parallel.

9. The method according to claim 1, wherein the primary rays, the re-emitted rays, and/or the diffused rays are recorded in a multidimensional matrix.

10. The method according to claim 1, wherein a property of material constituting a surface of an object of the scene is used for calculating the re-emitted rays and/or the diffused rays.

11. The method according to claim 1, wherein, determining the output signal of the sensor at step ii) comprises:
   e1) a sub-set of diffused rays is selected as a function of a predetermined criterion;
   e2) respective signals of the selected diffused rays are calculated only for the selected sub-set of diffused rays; and
   f) a signal received at the point of reception is calculated by adding the respective signals calculated at step e2).

12. The method according to claim 11, wherein the predetermined criterion is a criterion taking into account the transported power of the diffused rays, and/or at least one characteristic of adjacent rays.

13. The method according to claim 12, wherein the at least one characteristic of adjacent rays is a total covered distance and/or a phase of a transported signal.

14. The method according to claim 1, wherein at step b) an emission diagram is provided indicating power losses as a function of the direction of propagation; and the transported power by the plurality of primary rays is calculated as a function of the emission diagram.

15. A computer program comprising program code instructions for executing the steps of the method according to claim 1 when executed on a computer.

16. A recording medium readable by a computer on which a computer program comprising instructions for execution of steps of the method according to claim 1 is recorded.

17. The method according to claim 1, wherein the waves are electromagnetic or acoustic waves.

18. A wave sensor output generator for generating an output signal outputted by a sensor for a motor vehicle when the sensor is placed at a point of reception facing a three-dimensional scene, the sensor being provided to emit waves and produce the output signal as a function of waves received in return following emission of the emitted waves, the sensor output generator, comprising:
   a processor and a memory;
   a) the memory, capable of storing scene data representing the three-dimensional scene including at least one object having a plurality of surfaces, each of the plurality of surfaces having a normal;
   the processor configured to:
   i) simulate an emission of waves by the sensor and a propagation of the waves to determine rays received by the sensor, comprising:
      b) calculating a plurality of primary rays to be emitted by the sensor towards the scene in respective propagation directions; each of the primary rays being defined at least by a transported power, a position, and a direction of propagation;
      d) calculating a plurality of primary diffused rays as a function of the point of reception, each of the plurality of primary diffused rays being emitted in a direction other than a direction of a specular ray by a surface of the plurality of surfaces of the at least one object of the scene reached by a primary ray of the plurality of primary rays; and
      a ray diffused by a surface reached by an incident ray being a ray reflected by the reached surface under an effect of the incident ray, having a direction of propagation passing through the point of reception, and having a transported power that is at least a function of relative orientation between the incident ray and the normal to the reached surface; and
   ii) determine the output signal of the sensor as a function of the rays received by the sensor and predetermined characteristics of the sensor.

19. The generator according to claim 18, further comprising
   c) a calculator to calculate re emitted rays at each iteration and for each incident ray in question:
   determines if the incident ray, by propagation in a straight line, reaches a surface of an object of the scene; and
   if as a function of a predetermined interaction model between an incident ray and a surface of an object, at least one re-emitted ray is emitted after the interaction of the incident ray with the reached surface:
   determines a reached point on the reached surface; and,
   calculates the at least one re-emitted ray from the reached surface;
   the incident rays in question being:
   during a first iteration, the plurality of primary rays calculated at step b);
   during each subsequent iteration, the re-emitted rays calculated at a preceding iteration;
   the calculator of diffused rays being further capable, at step d), of calculating diffused rays emitted by the plurality of surfaces of the at least one object of the scene reached by the at least one re-emitted ray.

* * * * *